United States Patent [19]

Mahoney

[11] 3,869,678

[45] Mar. 4, 1975

[54] MULTIPLE TRANSISTOR MICROWAVE AMPLIFIER

[75] Inventor: Donald Edwin Mahoney, Hightstown, N.J.

[73] Assignee: RCA Corporation, New York, N.Y.

[22] Filed: Dec. 18, 1973

[21] Appl. No.: 425,936

[52] U.S. Cl. ............ 330/53, 330/30 R, 331/117 D, 330/38 M

[51] Int. Cl. ............ H03f 3/60

[58] Field of Search ........... 307/298; 330/53; 333/9; 331/117 D, 96

[56] References Cited

UNITED STATES PATENTS

| | | | |
|---|---|---|---|
| 3,371,284 | 2/1968 | Engelbrecht | 330/53 X |
| 3,436,669 | 4/1969 | Russell et al. | 330/21 |

*Primary Examiner*—Nathan Kaufman
*Attorney, Agent, or Firm*—Edward J. Norton; Joseph D. Lazar

[57] ABSTRACT

An input signal from a microwave source is divided equally between a parallel arrangement of multiple transistors by an input circuit having multiple transmission line center conductors with opposite ends capacitively coupled to a reference potential. The multiple transmission line center conductors of the input circuit are arranged to provide an impedance match between the signal source impedance and the transistor complex input impedance. An output signal from the parallel arrangement of multiple transistors is summed by an output circuit having multiple transmission line center conductors with opposite ends capacitively coupled to a reference potential. The multiple transmission line center conductors of the output circuit are arranged to provide an impedance match between the transistor complex output impedance and a terminating load impedance.

5 Claims, 3 Drawing Figures

MULTIPLE TRANSISTOR MICROWAVE AMPLIFIER

BACKGROUND OF THE INVENTION

1. Field of the Invention

This invention relates generally to microwave amplifiers and oscillators employing multiple solid state devices, and more particularly to microwave amplifiers and oscillators employing a parallel arrangement of multiple microwave transistors.

2. Description of the Prior Art

Microwave amplifier circuits employing a parallel arrangement of multiple microwave trans are well known. Prior art microwave amplifier circuits of this type usually include a conventional input power divider circuit having a first output port coupled to a first transistor input impedance matching structure and a second output port coupled to a second transistor input impedance matching structure. An electrode of a first transistor is coupled to the first transistor input impedance matching structure and an electrode of a second transistor is coupled to the second transistor input impedance matching structure. The input power divider is arranged so that equal portions of an input signal coupled to a power divider input port is transmitted to the first and second transistors.

Such prior art microwave amplifier circuits also have been provided with an output power summer circuit. This type of output power summer circuit is arranged so that an amplified output signal from the first transistor is coupled to a first input port of the power summer via a first transistor output impedance matching structure and an amplified output signal from the second transistor is coupled to a second input port of the power summer via a second transistor output impedance matching structure. The power summer provides a transmission path for an output signal which is the sum of the transistor amplified output signals provided however, that the relative phase of the amplified output signals from the first and second transistors are substantially equal.

The prior art amplifier circuit described above provided separate and distinct input and output impedance matching structures for each transistor in the amplifier circuit. The input and output impedance matching structures are usually arranged so that they are relatively difficult to tune for changes in operating frequency and input signal magnitude which are critical parameters for determining desired amplifier operation. For particular microwave amplifier circuits where total amplifier circuit dimensions are critical, the prior art amplifier circuits are not satisfactory. It is desirable to decrease total amplifier circuit dimensions by providing an amplifier circuit which does not require prior art impedance matching structures, power divider circuits, or summer circuits. Also, it is desirable to provide an amplifier circuit having a first tuneable structure arranged to match the input impedance of several transistors connected in parallel and a second tuneable structure arranged to match the output impedance of several parallel connected transistors.

SUMMARY OF THE INVENTION

Microwave signals are amplified by a circuit having first, second, third, fourth and fifth resonant lengths of transmission lines each having center conductors with opposite ends capacitively coupled to a reference potential. The center conductors of the first and second transmission lines are capacitively coupled to each other. The center conductors of the third and fourth transmission lines are capacitively coupled to the center conductor of the fifth transmission line. First and second semiconductor devices are arranged so that the first semiconductor device has a first terminal coupled to one end of the first transmission line center conductor, a second terminal coupled to the third transmission line center conductor and a third terminal coupled to the reference potential. The second semiconductor device has a first terminal coupled to the other end of the first transmission line center conductor, a second terminal coupled to the fourth transmission line center conductor and a third terminal coupled to the reference potential. An input microwave signal is coupled to the second transmission line center conductor by input signal coupling means. A D.C. bias signal is coupled to the first and second semiconductor devices by D.C. bias signal coupling means, whereby the first and second semiconductor devices are triggered into providing an output microwave signal. The output microwave signal is coupled from the fifth transmission line center conductor by output signal coupling means.

DESCRIPTION OF THE PREFERRED EMBODIMENT

Figure 1:
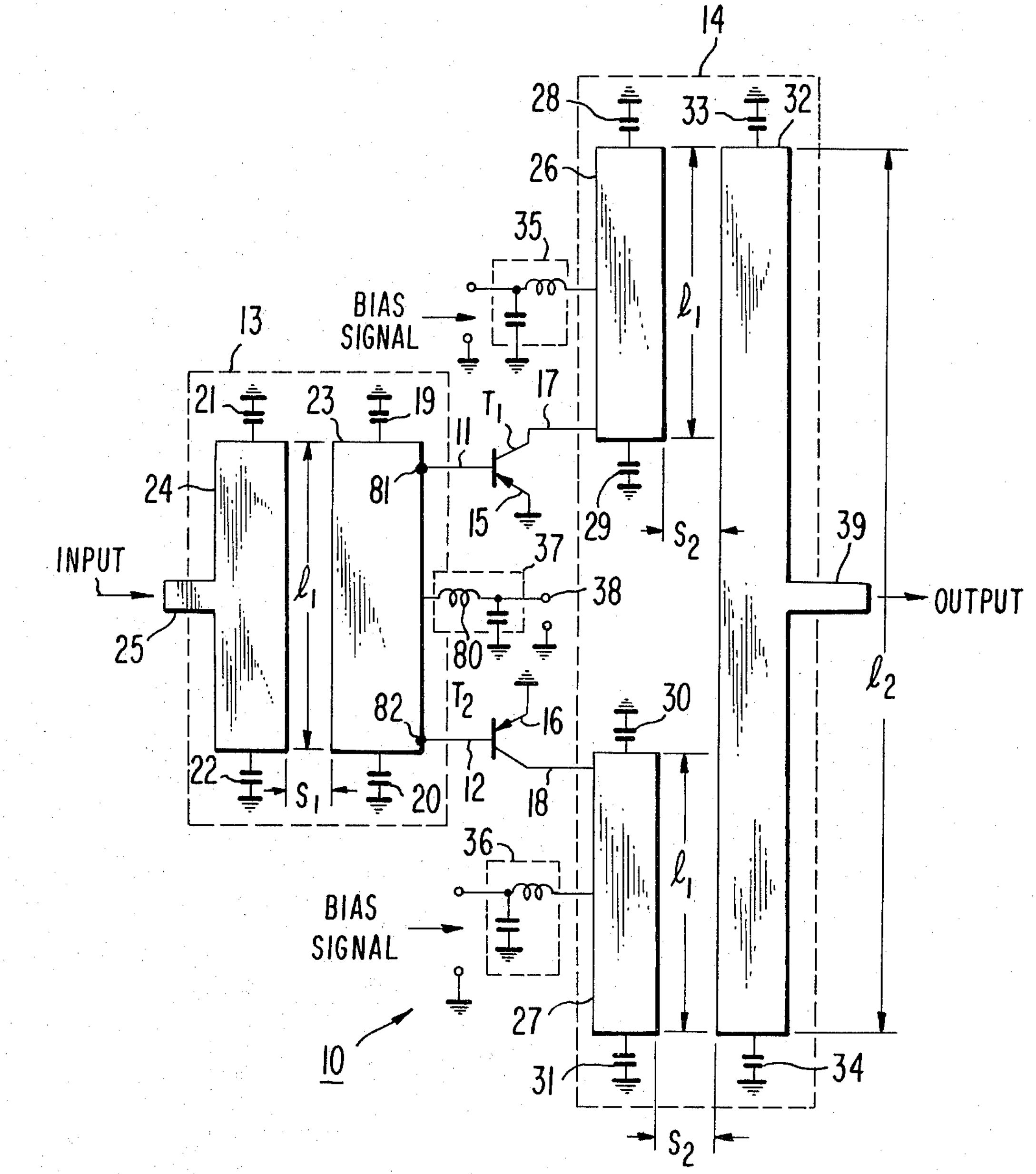
FIG. 1 is a schematic diagram of a microwave amplifier illustrating the principles of the present invention.

Referring to FIG. 1, there is shown a schematic diagram of a microwave amplifier 10 illustrating the principles of the present invention. Microwave amplifier 10 includes a parallel arrangement of transistors $T_1$ and $T_2$ connected between amplifier input section 13 and amplifier output section 14. Amplifier input section 13 is arranged, as will be further described, to divide an input signal equally between transistors $T_1$ and $T_2$ and to provide an impedance match between the complex input impedance $(R_1 + jX_1)$ presented by the parallel arrangement of transistors $T_1$ and $T_2$ and the impedance of an input signal source, not shown, coupled to center conductor 24 via conductor 25. Amplifier output section 14 is arranged, as will be further described, to sum output signals from transistor $T_1$ and $T_2$ and to provide an impedance match between the complex output impedance $(R_2 - jX_2)$ presented by the parallel arrangement of transistors $T_1$ and $T_2$ and the impedance of an amplifier terminating load, not shown, coupled to center conductor 32 via conductor 39.

Amplifier input section 13 includes a first, capacitively loaded, resonant section of transmission line having a center conductor 23 with an electrical length, $l_1$, of substantially $\lambda/8$, where $\lambda$ is the wavelength at input signal frequency $f_o$. A suitable transmission line may be a microstrip, stripline, coaxial or coplanar waveguide type transmission line all of which, as known in the art, having a center conductor for purposes to be described. Tuning capacitors 19 and 20 are disposed at opposite ends of center conductor 23. Capacitors 19 and 20 may be a prior art piston type variable capacitor or a type of capacitor constructed by use of distributed transmission line techniques well known in the art. Tuning capacitor 19 is for convenience of illustration schematically represented as a lumped capacitor having one terminal connected to ground potential and a second terminal coupled to one end of center conductor 23. Tuning capacitor 20 is also schematically represented as having one terminal coupled to the other end of transmission line 23.

A second, capacitively loaded, resonant section of transmission line having a center conductor 24 with an electrical length, $l_1$, of substantially $\lambda/8$, where $\lambda$ is the wavelength at input signal frequency $f_o$, is capacitively coupled to first transmission line 23. Capacitively coupling two lengths of transmission line center conductors to each other may be accomplished by separating the lengths of first and second center conductors 23 and 24, respectively, by a predetermined gap, $S_1$. This method of capacitively coupling two lengths of transmission line center conductors if further described in "Microwave Filters, Impedance-Matching Networks, and Coupling Structures" by George L. Matthaei et al., published by McGraw-Hill in 1964. Tuning capacitors 21 and 22 are disposed at opposite ends of center conductor 24.

The characteristic impedance of the transmission lines having center conductors 23 and 24, the gap, $S_1$, and the capacitive reactance provided by capacitors 19, 20, 21 and 22 are arranged to provide an impedance transformation or match from an impedance of an input signal source to the complex impedance presented by the parallel arrangement of transistors $T_1$ and $T_2$.

For purpose of illustration and not limitation, amplifier 10 is shown as a grounded emitter transistor amplifier, wherein emitter electrodes 15 and 16 of transistors $T_1$ and $T_2$, respectively, are connected to ground potential. Base electrode 11 of transistor $T_1$ is coupled to one end of center conductor 23 in relatively close proximity to the coupling point of capacitor 19. Base electrode 12 of transistor $T_2$ is coupled to the other end or opposite end of center conductor 23 in relatively close proximity to the coupling point of capacitor 20. Collector electrode 17 of transistor $T_1$ is coupled to one end of center conductor 26. Collector electrode 18 of transistor $T_2$ is coupled to one end of center conductor 27. Center conductors 26 and 27 are included as elements in output amplifier section 14 as will be described more completely below.

D.C. bias signals suitable for operating transistors $T_1$ and $T_2$, for example +28 volts, are coupled to center conductors 26 and 27 via bias circuits 35 and 36 respectively. Under amplifier operating conditions, bias circuit 37 having one end of inductor 80 directly coupled to transmission line 23, provides a return path to ground potential for D.C. signals by connecting terminal 38 of bias circuit 37 (the other end of inductor 80) to ground potential. Bias circuits 35, 36 and 37 are arranged, as known in the art, to provide a relatively low impedance conductive path for D.C. bias signals coupled to desired transistor terminals and a relatively high impedance or open circuit to signals at the amplifier output frequency.

Under operating conditions, an input signal at frequency $f_o$ from a microwave signal source, not shown, is directly coupled to second center conductor 24 via conductor 25. For maximum power transfer and stable amplifier operation, the source impedance must match the complex impedance presented by the parallel arrangement of properly D.C. biased transistors, $T_1$ and $T_2$, in amplifier 10. In addition, it is desirable that the input signal be substantially equally divided between transistors $T_1$ and $T_2$ and that the phase of the signals coupled to transistors $T_1$ and $T_2$ be substantially equal. Unlike prior art amplifier circuits having an arrangement of multiple transistors connected in parallel, amplifier 10 utilizes a suitable pair of capacitively terminated center conductors (i.e., matching section 13) for providing an impedance match from source impedance to transistor impedance as well as dividing an input signal equally between transistors $T_1$ and $T_2$. Thus, the usual conditions required for multiple transistor amplifier operation consisting of input signal power division and transistor impedance matching is provided, according to the invention, by a single input circuit utilizing a suitable pair of capacitively coupled transmission lines. Unlike prior art amplifier input circuits, input circuit 13 is arranged to have one input terminal 25 and the two output terminals 81 and 82 at opposite ends of center conductor 23 to which base electrodes 11 and 12 are respectively coupled. In addition, no microwave signal absorbing elements or termination are needed for proper operation of input circuit 13 as heretofore was considered a requirement for such an amplifier.

Capacitors 19 and 20 are adjusted to provide a capacitive reactance which effectively cancels the inductive reactance presented by respectively transistors $T_1$ and $T_2$ when the transistors are properly biased by appropriate D.C. signals and the divided transistor input signals having a predetermined magnitude. If either the D.C. bias signal or the input signal magnitude is changed, the transistor inductive reactance is thereby changed and capacitors 19 and 20 must be then readjusted accordingly. As previously described, the characteristic impedance of the transmission lines having center conductors 23 and 24, the dimension, $S_1$, of the capacitive coupling gap between transmission lines 23 and 24, and the capacitive reactance of capacitors 19, 20, 21 and 22 are selected to provide a desirable impedance transformation or match from the input signal source impedance to the complex input impedance of transistors $T_1$ and $T_2$. Capacitors 19, 20, 21 and 22 are adjusted in magnitude so that substantially equal portions of the input signal having approximately the same phase are coupled to base electrodes 11 and 12 of transistors $T_1$ and $T_2$, respectively. Capacitors 19, 20, 21 and 22 are also adjusted in magnitude so that the transmission lines having center conductors 23 and 24 are tuned to be resonant at input frequency $f_o$.

Output matching section 14 includes a first capacitively loaded, resonant section of transmission line having a center conductor 26 with an electrical length, $l_1$, of substantially $\lambda/8$, where $\lambda$ is the wavelength at input signal frequency $f_o$. Tuning capacitors 28 and 29 are disposed at opposite ends of center conductor 26. As previously described, collector electrode 17 of transistor $T_1$ is coupled to one end of center conductor 26. Center conductor 26 is substantially electrically isolated from input circuit 13 at input frequency $f_o$ by being physically displaced from input circuit 13 in order to prevent amplifier instability or undesired oscillation due to coupling or feedback of the amplified output signal from transistor $T_1$ to input circuit 13.

A second capacitively loaded, resonant section of transmission line having center conductor 27 with an electrical length, $l_1$, of substantially $\lambda/8$, where $\lambda$ is the wavelength at input frequency $f_o$, is included as an element in output circuit 14. Tuning capacitors 30 and 31 are disposed at opposite ends of center conductor 27. As previously described, collector electrode 18 of transistor $T_2$ is coupled to one end of center conductor 27. Center conductor 27 is substantially electrically isolated from input circuit 13 at input frequency $f_o$ by being physically displaced from input circuit 13 in order to prevent amplifier instability or undesired oscillation due to coupling or feedback of the amplified output signal from transistor $T_2$ to input circuit 13. Center conductor 27 is also displaced from center conductor 26 so as to provide output impedance tuning for transistor $T_2$ independent of the output impedance tuning provided for transistor $T_1$ by center conductor 26 and adjustable capacitors 28 and 29.

A third capacitively loaded, resonant section of transmission line having center conductor 32 with an electrical length, $l_2$, of substantially $\lambda/4$, where $\lambda$ is the wavelength at input frequency $f_o$, is capacitively coupled to center conductors 26 and 27. Tuning capacitors 33 and 34 are disposed at opposite ends of center conductor 32.

The characteristic impedance of transmission lines having center conductors 26, 27 and 32, the dimension, $S_2$, of the capacitive coupling gap between center conductors 26 and 32 and between center conductors 27 and 32, and the capacitive reactance of capacitors 28, 29, 30, 31, 33 and 34 are arranged to provide a desired impedance transformation or match from the complex output impedance of transistors $T_1$ and $T_2$ to the amplifier terminating load impedance, not shown, coupled to center conductor 32 via conductor 39. Capacitors 28, 29, 30, 31, 33 and 34 are also adjusted so that transmission lines having center conductors 26, 27 and 32 are tuned to be resonant at input frequency $f_o$.

Figure 2:
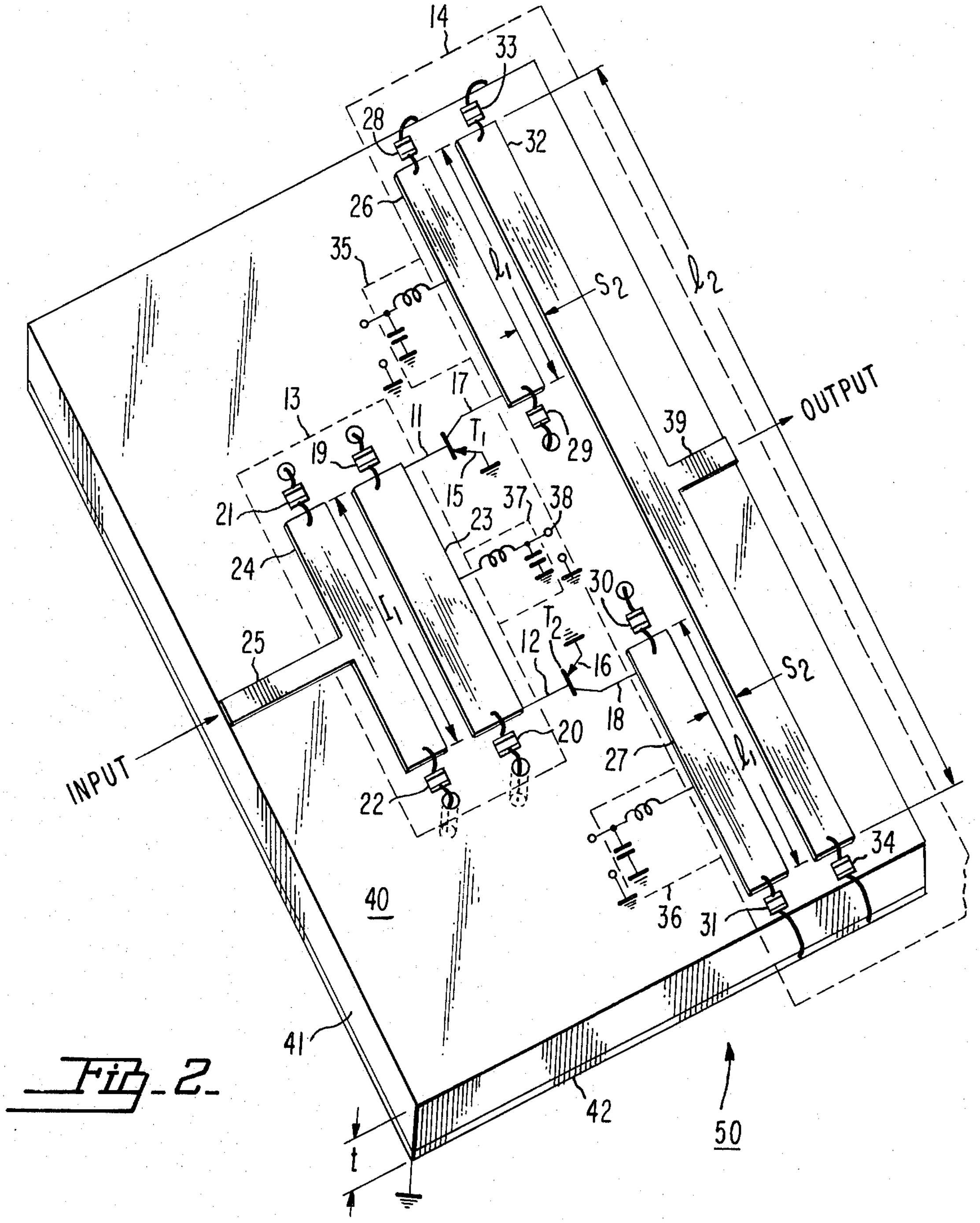
FIG. 2 is a top plan view of a microstrip transmission line multiple transistor amplifier embodiment of the present invention.

Referring now to FIG. 2, there is shown a top plan view of a microstrip transmission line multiple transistor amplifier 50 embodying the invention illustrated in FIG. 1, the reference numerals of like elements being repeated for convenience. Conductive strips 23, 24, 26, 27 and 32 are formed on one surface 40 of a suitable dielectric substrate 41 having a conductive surface 42 at ground potential on the other face of substrate 41. The thickness, $t$, of dielectric substrate 41 is 0.023 inches and the relative dielectric constant, $\epsilon_r$, of dielectric substrate 41 is substantially equal to 2.32.

Conductive strips 23 and 24 are formed to have widths of 0.200 and 0.055 inches, respectively, and to be separated from each other by a gap, $S_1$, of 0.010 inches over an electrical length, $l_1$, of substantially $\lambda/8$, where $\lambda$ is the microstrip transmission line wavelength at an input frequency ($f_o$) of 1.0 GHz. Capacitors 19 and 20 are suitable fixed capacitor chips disposed at opposite ends of conductive strip 23 in a manner described above and illustrated in FIG. 1. Similarly, capacitors 21 and 22 are suitable fixed capacitor chips disposed at opposite ends of conductive strip 24. Emitter electrodes 15 and 16 of transistors $T_1$ and $T_2$, respectively, are connected to conductive surface 42 at ground potential. Base electrodes 11 and 12 of transistors $T_1$ and $T_2$, respectively, are coupled to opposite ends of conductive strip 23. Collector electrode 17 of transistor $T_1$ is coupled to conductive strip 26 and collector electrode 18 of transistor $T_2$ is coupled to conductive strip 27. The capacitive reactance provided by capacitors 19, 20, 21 and 22, the widths of conductive strips 23 and 24 and the gap, $S_1$, separating conductive strips 23 and 24 are chosen to provide an impedance transformation from a signal source impedance of 50 ohms to the impedance of a parallel arrangement of two, properly biased, transistors, $T_1$ and $T_2$. The complex input impedance of each of transistors $T_1$ and $T_2$ is substantially $0.8 + j3.0$ ohms at an input frequency of 1.0 GHz.

The width of each of the conductive strips 26, 27 and 32 in output circuit 14 is 0.062 inches. The gap, $S_2$, separating conductive strips 26 and 27 from conductive strip 32 is 0.020 inches. The electrical length ($l_1$) of conductive strips 26 and 27 is substantially $\lambda/8$, and the electrical length of conductive strip 32 ($l_2$) is substantially $\lambda/4$, where $\lambda$ is the microstrip transmission line wavelength at input signal frequency 1.0 GHz. Capacitors 28 and 29 are suitable fixed magnitude capacitor chips disposed at opposite ends of conductive strip 26. Capacitor pairs 30 and 31 and 33 and 34 are suitable fixed magnitude capacitor chips disposed at opposite ends of conductive strips 27 and 32, respectively. The capacitive reactance provided by capacitors 28, 29, 30, 31, 33 and 34, the widths of conductive strips 26, 27 and 32 and the gap $S_2$, separating conductive strips 26 and 27 from conductive strip 32 are selected as described above in conjunction with FIG. 1, to provide an impedance transformation from a complex transistor output impedance presented by the parallel arrangement of transistors $T_1$ and $T_2$ to an amplifier terminating load impedance, not shown, coupled to conductive strip 39.

Under operating conditions, a D.C. bias signal of +28 volts from a battery or other suitable source, not shown, is coupled to collector electrodes 17 and 18 of transistors $T_1$ and $T_2$, respectively, via D.C. bias circuits 35 and 36. Terminal 38 of D.C. bias circuit 37 is connected to conductive surface 42 at ground potential. In operation of amplifier 50 of FIG. 2, a 400 mw input signal at 1.0 GHz coupled to conductive strip 25 was amplified to 2.4 watts and transmitted to an amplifier terminating load, not shown, suitably coupled to conductive strip 39. As known in the art, connectors for suitably coupling microwave signals to and from amplifier 50 may be connected to conductive strips 25 and 39.

Figure 3:
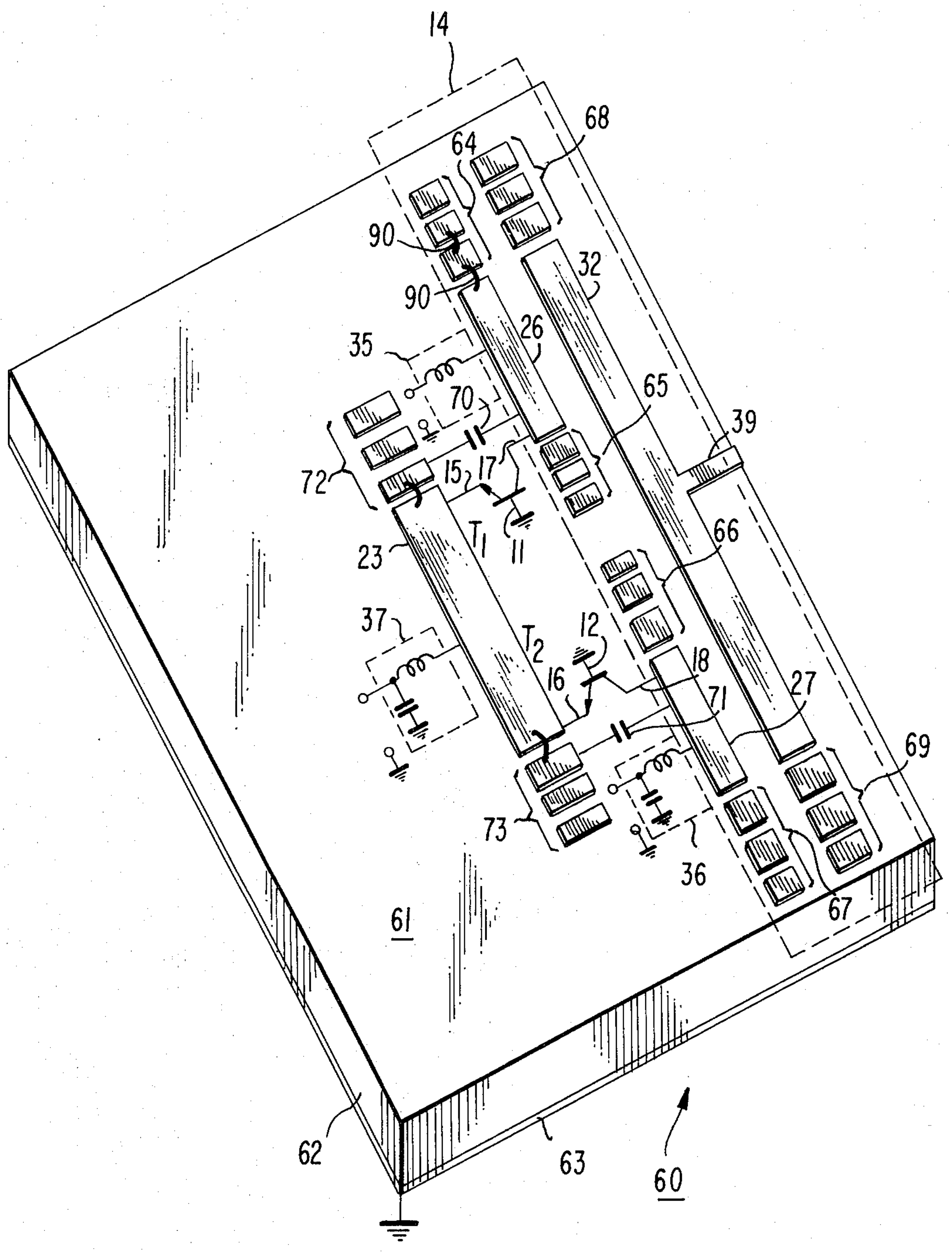
FIG. 3 is a top plan view of a microstrip transmission line multiple transistor oscillator embodiment of the present invention.

Referring to FIG. 3, there is shown a top plan view of another form of the invention embodied as a microstrip transmission line multiple transistor oscillator 60. Reference numerals common to FIGS. 1 and 2 are again used for convenient reference to like elements. Conductive strips 23, 26, 27 and 32 are microstrip transmission line center conductors on one surface 61 of a suitable dielectric substrate 62 having an opposite conductive surface 63 at ground potential. Conductive strips 26, 27 and 32 are arranged to form a transistor output circuit 14. Transistor output circuit 14 is arranged to be resonant at a desired frequency of oscillation of the two transistors $T_1$ and $T_2$ and to provide an impedance transformation from the output impedance of transistors $T_1$ and $T_2$ as previously described with respect to FIGS. 1 and 2. Conductive strips 64 and 65 disposed at opposite ends of conductive strip 26 are used to extend the electrical length of conductive strip 26, when suitably bonded or connected to conductive strip 26 as by bonding leads 90 as needed. The electrical length of conductive strip 26 can then be varied or adjusted from substantially λ/8 to that electrical length which would resonate with the fringing capacitance present at the extremities of conductive strip 26. Fringing capacitance at the extremity of a microstrip transmission as further described on page 181 of the book "Microwave Filters, Impedance-Matching Networks, And Coupling Structures" by Matthaei et al. published by McGraw-Hill may be provided as an alternative to the fixed magnitude of tuneable piston type capacitors described above. In a similar manner, the electrical length of conductive strip 27 is extended by bonding or connecting to conductive strip 27 conductive strips 66 and 67 disposed at opposite ends of conductive strip 27 and that fringing capacitance may be used to resonate conductive strip 27. Similarly, conductive strips 68 and 69 disposed at opposite ends of conductive strip 32 can be used to resonate and extend the electrical length of conductive strip 32.

Emitter electrodes 15 and 16 of transistors $T_1$ and $T_2$, respectively, are connected to opposite ends of conductive strip 23. Base electrodes 11 and 12 of transistors $T_1$ and $T_2$, respectively, are coupled to conductive strip 63 or ground potential. Collector electrode 17 of transistor $T_1$ is coupled to conductive strip 26 and collector electrode 18 of transistor $T_2$ is coupled to conductive strip 27, in a manner similar to that described for FIGS. 1 and 2.

Conductive strips 72 and 73 disposed at opposite ends of conductive strip 23 are used to extend the electrical length of conductive strip 23 to a resonant length when suitably bonded or connected to conductive strip 26 as described above for conductive strips 26 and 27. Feedback capacitor 70 is connected between conductive strip 26 and one extremity of conductive strip 23, and feedback capacitor 71 is connected between conductive strip 27 and the other extremity of conductive strip 23. An example of a suitable feedback capacitor is a piston type capacitor well known in the art. Feedback capacitors 70 and 71 and conductive strip 23 provide a suitable oscillator feedback loop for feedback signals from transistors collector electrodes 17 and 18 to transistor emitter electrodes 15 and 16. It should be noted that in the embodiment of the invention as an oscillator, the combination of feedback capacitors 70 and 71, and the characteristic impedance of the resonant length of microstrip transmission line center conductor 23 is chosen to match the base-emitter impedance or input impedance of transistors $T_1$ and $T_2$ to the collector-base impedance of transistors $T_1$ and $T_2$ or the source of the feedback signals. Thus, unlike the amplifier having center conductors 23 and 24 for transistor input impedance matching described in FIGS. 1 and 2, only one center conductor 23 and feedback capacitors 70 and 71 are used for transistor input impedance matching in oscillator circuit 60 described in FIG. 3.

In operation the oscillator 60 of FIG. 3 oscillates when a D.C. bias is coupled to collector electrodes 17 and 18 and emitter electrodes 15 and 16 of transistors $T_1$ and $T_2$, respectively, by suitable D.C. bias circuits 35, 36 and 37 previously described with respect to FIG. 1. Although a microstrip transmission line has been used to illustrate the invention as an embodiment of a multiple transistor oscillator (60, FIG. 3) it is to be understood as will be appreciated by those skilled in this art that other types of microwave transmission line may be used as for example stripline transmission line previously described.

In summary, according to the invention, a microwave apparatus is disclosed which includes a three terminal signal divider having multiple capacitively terminated transmission lines for dividing an input signal between the electrodes of multiple transistors and a three terminal signal summing circuit having multiple capacitively terminated transmission lines for summing amplified signals from each of the multiple transistors. In addition, the capacitively terminated transmission lines are arranged to provide an impedance match between a complex impedance presented by the arrangement of multiple transistors and the impedance of a signal source or apparatus terminating load. It is to be understood that the disclosed impedance matching and signal dividing concepts are not limited to the use of two transistors but circuits having two or more semiconductor devices may be used in practicing the invention as will be apparent to those skilled in the art.

What is claimed is:

1. An amplifier comprising:

first, second, third, fourth and fifth resonant lengths of transmission lines each having center conductors with opposite ends capacitively coupled to a reference potential;

input circuit means having an input terminal and first and second output terminals and said first and second transmission line center conductors being respectively capacitively coupled to each other for dividing an input signal coupled to said input terminal between said output terminals with substantially equal magnitude and equal relative phase;

output circuit means having first and second input terminals and an output terminal and said third and fourth transmission line center capacitively coupled to said fifth transmission line center conductor for summing input signals coupled to said first and second input terminals of said output circuit;

a first semiconductor device having first, second and third terminals, an input impedance and an output impedance, said first terminal of said first device being coupled to said first output terminal of said input circuit, said second terminal of said first device being coupled to said first input terminal of said output circuit and said third terminal of said first device being coupled to said reference potential, said first and second transmission line center conductors being mutually arranged to match said first semiconductor input impedance and said third and fifth transmission line center conductors being mutually arranged to match said first semiconductor output impedance;

a second semiconductor device having first, second and third terminals, an input impedance and an output impedance, said first terminal of said second device being coupled to said second output terminal of said input circuit, said second terminal of said second device being coupled to said second input terminal of said output circuit and said third terminal of said second device being coupled to said reference potential, said first and second transmission line center conductors being mutually arranged to match said second semiconductor input impedance and said fourth and fifth transmission line center conductor being mutually arranged to match said second semiconductor output impedance;

means for coupling an input microwave signal to said input circuit input terminal;

means for coupling a predetermined D.C. bias to said first and second semiconductor devices; and means responsive to said input microwave signal and said D.C. bias for coupling an output microwave signal from said output circuit output terminal.

2. An amplifier according to claim 1, wherein said first, second, third, fourth and fifth transmission line center conductors include respectively first, second, third, fourth and fifth coplanar conductive strips on one surface of a dielectric substrate, said substrate having a conductive surface, opposite said one surface, at said reference potential.

3. An amplifier according to claim 1, wherein said capacitive coupling of said first and second transmission line center conductors to each other includes a first relatively small gap separating said first transmission line center conductor from said second transmission line center conductor.

4. An amplifier according to claim 1, wherein said capacitive coupling of said third and fourth transmission line center conductors to said fifth transmission line center conductor includes a second relatively small gap separating said third transmission line center conductor from said fifth transmission line center conductor and a third relatively small gap separating said fourth transmission line center conductor from said fifth transmission line center conductor.

5. An amplifier comprising:

a signal divider means having an input terminal and first and second output terminals, said signal divider means having first and second transmission line center conductors capacitively coupled respectively to each other and each of said first and second center conductors having opposite ends capacitively coupled to a reference potential;

a signal summing means having first and second input terminals and an output terminal, said signal summing means having third and fourth transmission line center conductors capacitively coupled to a fifth transmission line center conductor, said third, fourth and fifth transmission line center conductors each having opposite ends capacitively coupled to a reference potential;

a first semiconductor device having a first terminal coupled to said signal divider first output terminal, a second terminal of said first device coupled to said first input terminal of said signal summing means and a third terminal of said first device coupled to said reference potential;

a second semiconductor device having a first terminal coupled to said signal divider second output terminal, a second terminal of said second device coupled to said second input terminal of said signal summing means and a third terminal of said second device coupled to said reference potential, and;

means for coupling a D.C. bias to said first and second semiconductor devices.

* * * * *